United States Patent [19]
Mizuno

[11] Patent Number: 4,794,981
[45] Date of Patent: Jan. 3, 1989

[54] COOLING SYSTEM

[75] Inventor: Tsukasa Mizuno, Tokyo, Japan

[73] Assignee: NEC Corporation, Tokyo, Japan

[21] Appl. No.: 36,437

[22] Filed: Apr. 9, 1987

[30] Foreign Application Priority Data

Apr. 9, 1986 [JP] Japan .................. 61-82724

[51] Int. Cl.$^4$ .......................... F28F 7/00; H05K 7/20
[52] U.S. Cl. .................... 165/80.4; 165/185;
361/387; 29/829; 29/840
[58] Field of Search ............ 165/185, 80.4, 80.3;
357/82; 174/16 HS; 361/385, 388, 386, 387;
29/840, 839, 829

[56]  References Cited
U.S. PATENT DOCUMENTS

| | | | |
|---|---|---|---|
| 4,109,707 | 8/1978 | Wilson et al. | 165/185 |
| 4,282,924 | 8/1981 | Faretra | 165/804 |
| 4,489,570 | 12/1984 | Little | 165/185 X |
| 4,546,410 | 10/1985 | Kaufman | 165/185 |
| 4,574,879 | 3/1986 | DeGree et al. | 165/185 |
| 4,602,125 | 7/1986 | West et al. | 165/185 |
| 4,602,678 | 7/1986 | Fick | 165/185 |
| 4,644,385 | 2/1987 | Nakanishi et al. | 165/80.4 X |
| 4,666,545 | 5/1987 | DeGree et al. | 165/185 X |
| 4,686,606 | 8/1987 | Yamada et al. | 357/82 X |

OTHER PUBLICATIONS

*IBM Bulletin* "High Performance Air-Cooled Module", vol. 28, No. 7, Dec. 1985.
*IBM Technical Disclosure Bulletin*, vol. 20, No. 4, Sep. 1977, "Method of Effective Cooling of a High Power Silicon Chip", Dee et al.

*Primary Examiner*—Ira S. Lazarus
*Assistant Examiner*—Peggy Neils
*Attorney, Agent, or Firm*—Burns, Doane, Swecker & Mathis

[57]  ABSTRACT

A cooling system for electronic components includes a substrate on which electronic components are mounted. A first layer made of adhesive material is provided on a surface of the substrate opposite the components and a second layer made of a material having a relatively low melting point is provided on the first layer. Heat radiating means are provided on the second layer to outwardly radiate heat transmitted from the electronic components through the substrate, first layer and second layer.

8 Claims, 2 Drawing Sheets

COOLING SYSTEM

BACKGROUND OF THE INVENTION

The present invention relates to a cooling system used for a package mounting a plurality of heat-generating electronic components such as integrated circuits (IC's) on a substrate.

A prior art cooling system for a package mounting electronic components on a substrate is disclosed in U.S. Pat. No. 4,109,707. The system comprises a micropackage mounting a plurality of IC's on the upper surface of a substrate, a connector connected to the package, and a heat exchanger in contact with the lower surface of the substrate mounting no IC. Liquid coolant such as water flows inside the exchanger. The exchanger is provided with a flexible thin plate on the bottom thereof. The lower surface of the package is not completely flat. In order to efficiently conduct the heat generated from the IC's into the coolant, it is critically necessary to force the flexible plate to come into close contact with the lower surface without clearances therebetween. To obtain such close contact, the system tries to bring the plate in close contact with the lower surface by deforming the plate with the pressure of water circulating inside exchanger.

In the system, the plate provided on the bottom of the exchanger is made of an extremely thin copper sheet having a thickness of 0.05 to 0.25 milimeters in order to obtain superior flexibility. However, since it is made of such a thin sheet of material, the water pressure used to press the plate against the lower surface, which is a determinant factor of the thermal resistance between the plate and the lower surface, cannot be increased to thereby present an impediment in reducing the thermal resistance between the substrate and the exchanger. Because of its weakness, the plate must be handled with utmost care when it is removed from the package at the time of replacement. If the plate is damaged, the water inside the exchanger may leak to malfunction the IC's.

SUMMARY OF THE INVENTION

An object of this invention is to provide a cooling system which is free of aforementioned problems.

According to an aspect of the invention, there is provided a cooling system which comprises: a substrate mounting electronic components; a first layer made of adhesive provided on one surface of the substrate; a second layer made of a material having a low melting point and provided on the first layer; and a heat-radiating means provided on the second layer to outwardly radiate heat transmitted from the components through the substrate, the first layer and the second layer.

BRIEF DESCRIPTION OF THE DRAWINGS

The preferred embodiment of the invention is discussed in the following detailed description which should be considered in connection with the accompanying drawing, in which.

In the figures, the same reference numerals represent the same structural elements.

PREFERRED EMBODIMENT

Figure 1:
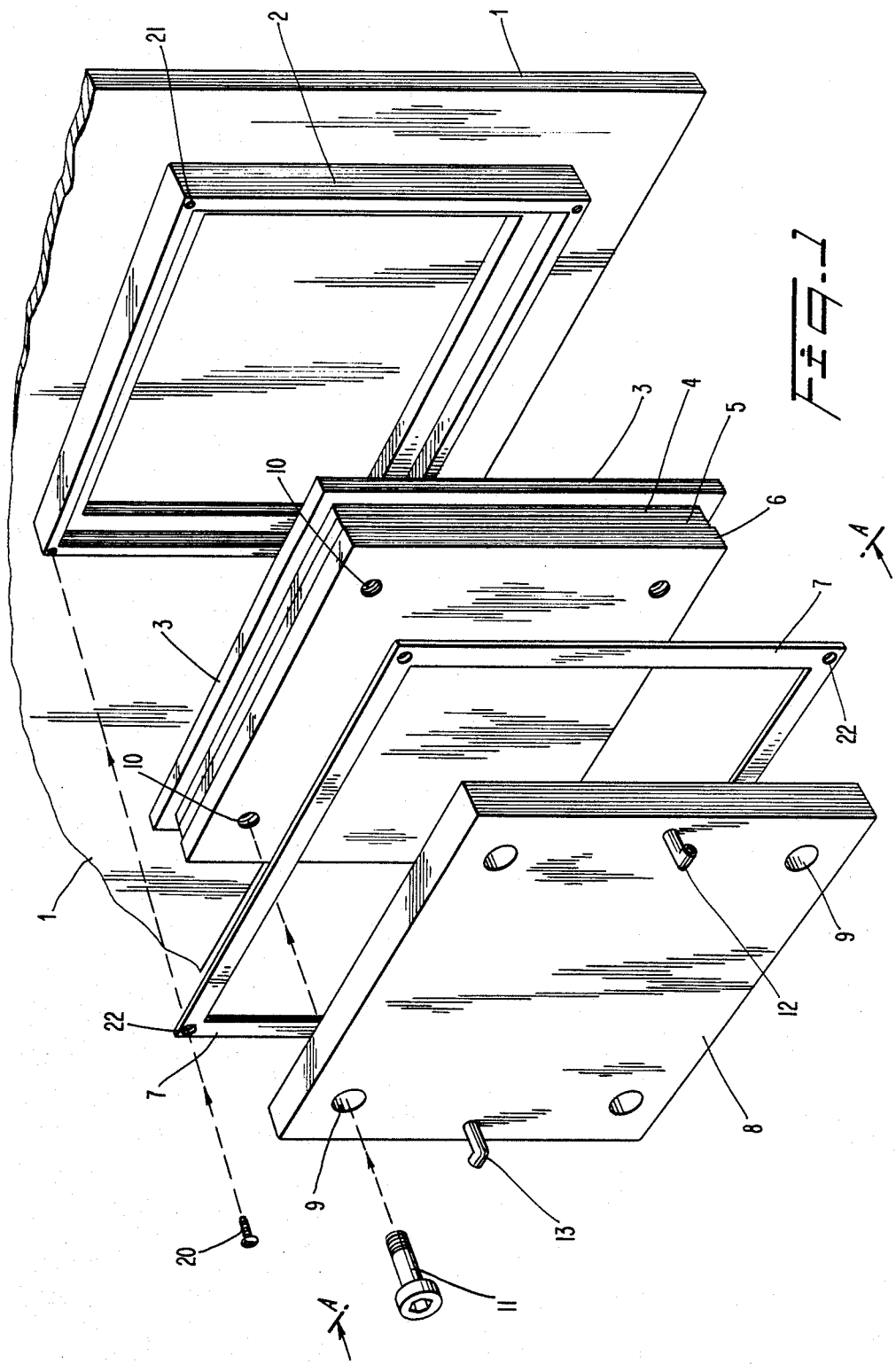
FIG. 1 is a perspective view of an embodiment of the invention.
Figure 2:
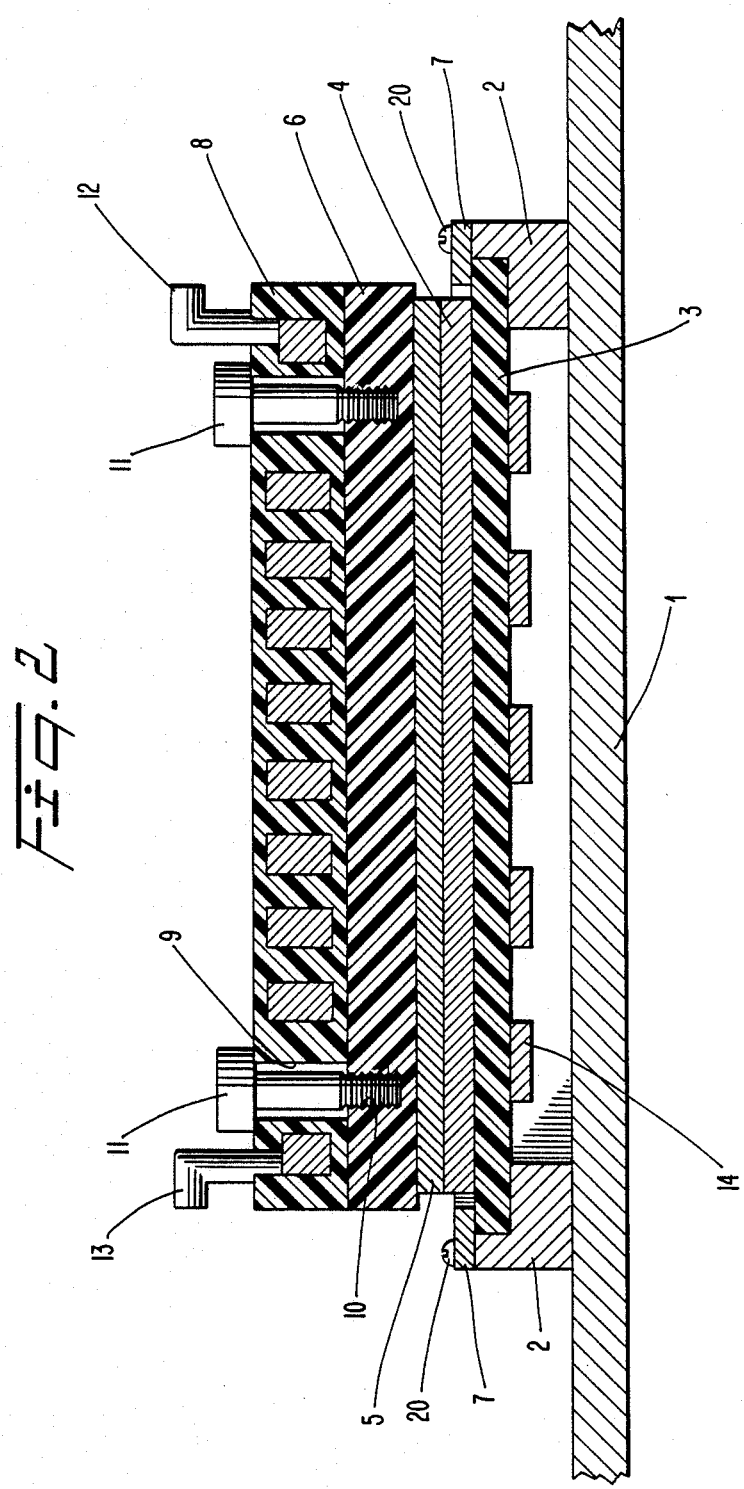
FIG. 2 is a cross-sectional view of the embodiment.

Referring to FIGS. 1 and 2, an embodiment of the invention comprises a printed circuit board 1, a connector 2, a wiring substrate 3, adhesive 4, a metal layer 5 made of a material having a low melting point, a radiating block 6, a holder 7, a cold plate 8, through holes 9, threaded holes 10, screws 11 for engaging with the holes 10, an inlet 12 for coolant, an outlet 13 for coolant, IC chips 14, threaded holes 21 and through holes 22.

In the drawings, the upper surface of the substrate 3 is provided with a plurality of heat-generating components including the IC chips 14. The holder 7 is attached to the connector 2 by the screws 20 which penetrate through the holes 22 to engage with the holes 21. As a result, the substrate 3 is forced against the connector 2 with the holder 7 to electrically connect the IC chips 14 with wiring patterns in the board 1. The layer 5 made of solder or wax material is formed on the lower surface of the block 6. The layer 5 is fixed to the lower surface of the substrate 3 by the adhesive 4 obtained by mixing silicone rubber and a filler of high thermal conductivity. In the manner mentioned above, there is formed a module comprising the substrate 3, the adhesive 4, the layer 5 and the block 6. In the embodiment, no gap or clearance between the substrate 3 and the block 6 is caused by deformations such as warps on the substrate 3 or the block 6 which are often seen in the above-mentioned prior art structure. Since the flexible adhesive 4 is used, there will be no gaps or clearances between the substrate 3 and the block 6 due to such a difference even if the thermal expansion coefficient of the substrate 3 may differ from that of the block 6. The block 6 is snugly fixed to the cold plate 8 inside which liquid coolant is circulated. The opposed surfaces of the block 6 and the plate 8 are finished to give a particularly high flatness. The heat generated from the IC chips 14 is conducted through the substrate 3, the adhesive 4 and the layer 5 to the block 6. Since there is no gap or clearance on the heat conductive path, the thermal resistance of the path can be kept low. Further, because the block 6 and the plate 8 are closely pressed to each other with a high pressure applied by the screw 11, the thermal resistance therebetween can also be kept low. The heat generated from the IC chips 14 reaches the cold plate 8 to be radiated outside by the coolant circulating through the plate 8. As is described above, unlike the prior art structure the embodiment does not use any flexible thin sheets to enhance mechanical strength and avoid possibility of any water leakage which may be caused by careless handling.

When the block 6 is to be removed from the substrate 3 at the time of replacement of defective one or ones of the IC chips 14, it would be extremely difficult to separate one from the other if they are adhered to each other with the adhesives 4 alone. However, since the embodiment uses the layer 5, they are easily separated simply by melting the layer, and the adhesive 4 can be easily removed from the substrate 3 after the separation. When re-assembling them, the layer 5 is formed again on the lower surface of the block 6 and the block 6 is then ready to be adhered to the substrate 3 with the adhesive 4.

Although the plate 8 through which the coolant is circulated is used in the embodiment, a heat sink for air cooling may be used in place of the plate 8.

While this invention has been illustrated and described in accordance with a preferred embodiment, it is recognized that variations and changes may be made and equivalents employed herein without departing from the invention as set forth in the claims.

What is claimed is:

1. A cooling arrangement for electronic components comprising:
   a substrate having first and second surfaces,
   at least one electronic component mounted on the first surface of said substrate,
   a first layer of adhesive material provided on said second surface of said substrate,
   a second layer of a material having a low melting point relative to said first layer, said second layer of material being provided on said first layer, and
   heat-radiating means on said second layer to outwardly radiate heat transmitted from said components through said substrate, said first layer and said second layer.

2. The cooling arrangement according to claim 1, wherein the material of said second layer is metallic.

3. The cooling arrangement according to claim 2, wherein the material of said second layer is solder.

4. The cooling arrangement according to claim 1, wherein the material of said second layer is wax.

5. The cooling arrangement according to claim 2, wherein said first layer is provided to fix said second layer against said substrate, the adhesive material of said first layer being formed of a mixture of silicone rubber and a thermally conductive filler material.

6. The cooling arrangement according to claim 1, wherein said heat-radiating means includes a heat-radiating block connected to said substrate by said second layer so that no gaps exist between said substrate and said block.

7. A method for replacing electronic components mounted on a cooling arrangement comprising the steps of:
   heating the cooling arrangement to a temperature above the melting point of a second layer of material which is interposed between a heat-radiating element and a substrate and which is held to the substrate by a first layer of adhesive material,
   removing the heat-radiating element from the cooling arrangement,
   replacing at least one electronic component which is mounted on the substrate,
   reforming a second layer on the heat-radiating element, and
   connecting the reformed second layer to the substrate through the first layer provided on the substrate.

8. The method according to claim 7, further comprising the steps of removing the first layer of adhesive material from the substrate after the heat radiating means has been removed from the cooling arrangement, and forming a new first layer of adhesive material on the substrate after replacement of at least one electronic component.

* * * * *